(12) United States Patent
Lin

(10) Patent No.: US 7,728,220 B2
(45) Date of Patent: Jun. 1, 2010

(54) SOLAR POWER GENERATING DEVICE

(75) Inventor: Chien-Feng Lin, Hsinchu (TW)

(73) Assignee: Pacific Speed Limited, Wanchai (HK)

( * ) Notice: Subject to any disclaimer, the term of this patent is extended or adjusted under 35 U.S.C. 154(b) by 384 days.

(21) Appl. No.: 11/822,622

(22) Filed: Jul. 9, 2007

(65) Prior Publication Data

US 2009/0014068 A1 Jan. 15, 2009

(51) Int. Cl.
*H01L 31/00* (2006.01)
*H01L 31/042* (2006.01)

(52) U.S. Cl. .................. 136/256; 136/259; 136/246

(58) Field of Classification Search .............. 136/259, 136/265, 256, 246
See application file for complete search history.

(56) References Cited

U.S. PATENT DOCUMENTS

| | | | | |
|---|---|---|---|---|
| 4,234,352 A | * | 11/1980 | Swanson | 136/253 |
| 4,910,415 A | * | 3/1990 | Yoshimura | 307/147 |
| 6,452,089 B1 | * | 9/2002 | Kubota | 136/251 |
| 2004/0261839 A1 | * | 12/2004 | Gee et al. | 136/256 |
| 2005/0189139 A1 | * | 9/2005 | Stole | 174/260 |

* cited by examiner

*Primary Examiner*—Basia Ridley
*Assistant Examiner*—Lindsey Bernier
(74) *Attorney, Agent, or Firm*—Muncy, Geissler, Olds, & Lowe, PLLC

(57) ABSTRACT

A solar power generating device includes a solid cylindrical conductive body partially surround by a hollow cylindrical conducting layer with an insulating layer located between them, and a solar energy converter located at an end of the conductive body with two electrodes separately electrically connected to the conducting layer and the conductive body, so that the solar power generating device is configured as a plug-in module that could be very easily mounted to and dismounted from a circuit board.

12 Claims, 6 Drawing Sheets

SOLAR POWER GENERATING DEVICE

FIELD OF THE INVENTION

The present invention relates to a solar power generating device, and more particularly to a solar power generating device configured as a plug-in module for easy mounting to and dismounting from a circuit board.

BACKGROUND OF THE INVENTION

Considering the depletion of petrochemical fuels available on the earth and the worsening greenhouse effect, energy sources, such as water power generation, wind power generation, geothermal power generation, and solar power generation that do not cause environment pollution have been gradually exploited for use. Among others, solar power generation is more frequently utilized by people because it requires only a solar collector panel to collect solar energy. However, to mount a conventional solar collector panel, a user has to screw a support frame to the ground first, and then screws the solar collector panel to the support frame. The user also has to distinguish the positive electrode from the negative electrode of the solar collector panel, and then correctly connects the solar collector panel to other power-consuming device or power accumulating means. Therefore, the mounting of the conventional solar collector panel involves very complicate and troublesome procedures. Similarly, a lot of complicate and troublesome procedures are also required to dismount or replace the conventional solar collector panel. These disadvantages prevent the conventional solar collector panel from being widely accepted for use in different applications.

It is therefore tried by the inventor to develop a solar power generating device that could be very easily mounted to and dismounted from a circuit board, so that solar energy could be more widely utilized in people's daily life.

SUMMARY OF THE INVENTION

A primary object of the present invention is to provide a solar power generating device that is configured as a plug-in module for easy mounting to and dismounting from a circuit board.

To achieve the above and other objects, the solar power generating device according to the present invention includes a conductive body in the form of a long bar; a solar energy converter located at an end of the conductive body with a first electrode of the solar energy converter electrically contacting with that end of the conductive body; a first insulating layer fitted around a portion of the conductive body closer to the solar energy converter; and a conducting layer fitted around the first insulating layer and therefore isolated from the conductive body by the first insulating layer, and electrically connected to at least one second electrode of the solar energy converter.

The conductive body is plugged into a circuit board with a portion thereof not covered by the first insulating layer in electrical contact with a first conducting layer covered on a substrate of the circuit board. However, the conducting layer is, on the one hand, isolated from the first conducting layer by a second insulating layer covered on the first conducting layer, and on the other hand, in electrical contact with a second conducting layer covered on the second insulating layer.

The solar energy converter is adapted to absorb solar energy and convert the absorbed solar energy into electric energy, which is then transferred to the first and the second conducting layer of the circuit board via the conductive body and the conducting layer, respectively.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
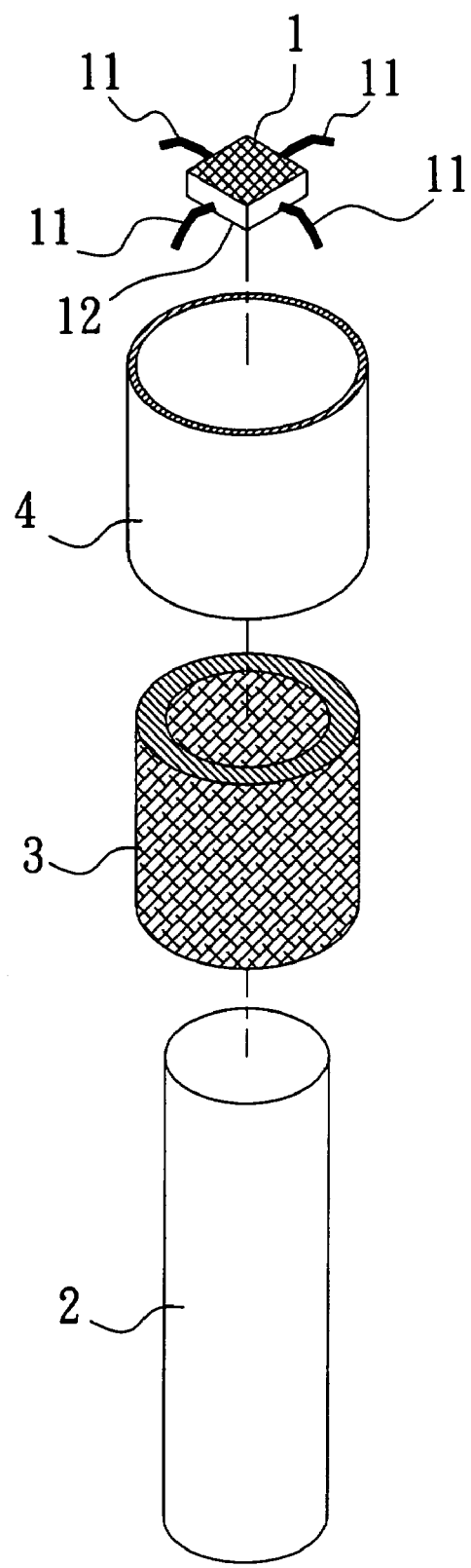
FIG. 1 is an exploded perspective view of a solar power generating device according to a first preferred embodiment of the present invention.
Figure 2:
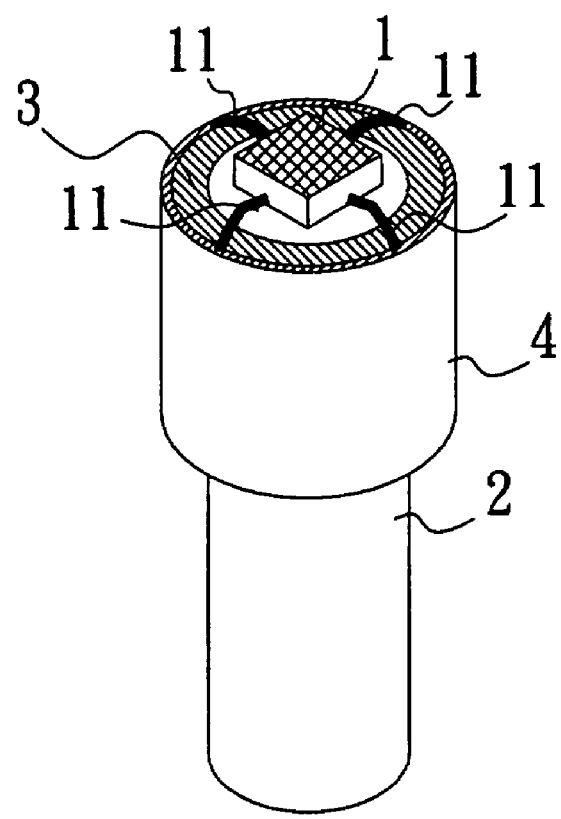
FIG. 2 is an assembled view of FIG. 1.
Figure 3:
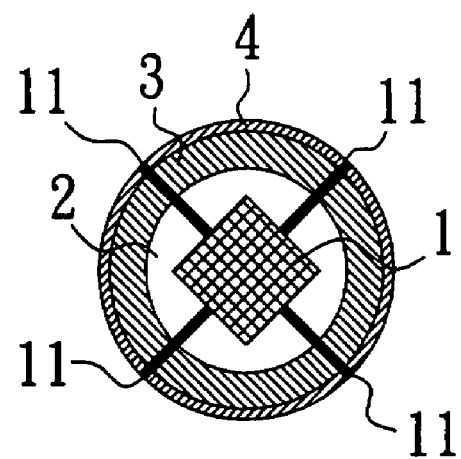
FIG. 3 is a top view of FIG. 2.

Please refer to FIGS. 1 and 2 that are exploded and assembled perspective views, respectively, of a solar power generating device according to a first preferred embodiment of the present invention, and to FIG. 3 that is a top view of FIG. 2. As shown, the solar power generating device according to the first preferred embodiment of the present invention includes a solar energy converter 1, a conductive body 2, a first insulating layer 3, and a conducting layer 4. The conductive body 2 is configured as a long bar, such as a solid cylindrical body, and may be made of a copper material. The solar energy converter 1 is located at an end of the conductive body 2 with a first electrode 12 of the solar energy converter 1 electrically connected to that end. The first insulating layer 3 may be a hollow cylinder fitted around a portion of the conductive body 2 closer to the solar energy converter 1. The conducting layer 4 is a hollow cylinder made of an aluminum material fitting around the first insulating layer 3 and isolated from the conductive body 2. The solar energy converter 1 has at least one second electrode 11 electrically connected to the conducting layer 4. With the above arrangements, the solar power generating device of the present invention is actually in the form of a plug-in module.

Figure 4:
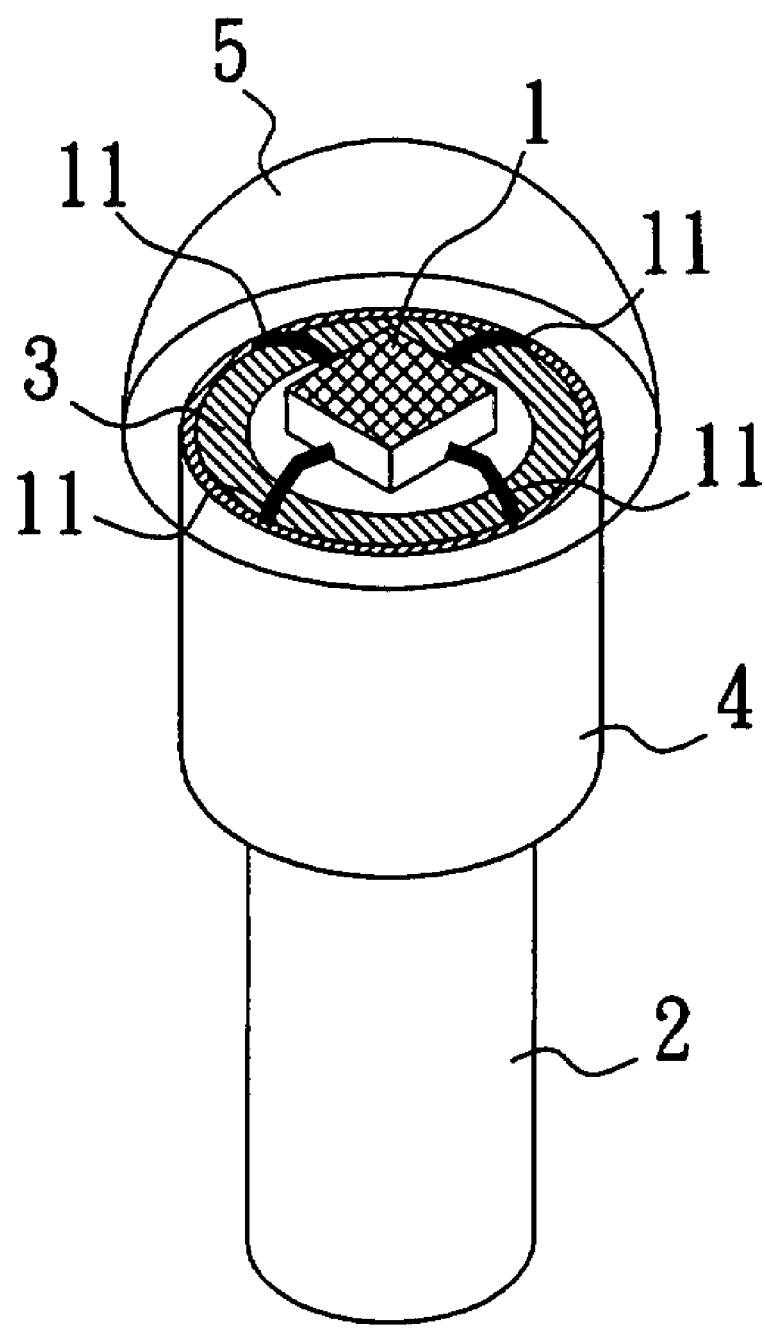
FIG. 4 is an assembled perspective view of a solar power generating device according to a second preferred embodiment of the present invention.

FIG. 4 is an assembled perspective view of a solar power generating device according to a second preferred embodiment of the present invention. As shown, the second embodiment is generally similar to the first embodiment, except for a solar-collecting hood 5, which encloses an end of the solar power generating device having the solar energy converter 1 mounted thereto, so as to focus sun light on the solar energy converter 1 to enable increased solar-power generation. The solar-collecting hood 5 also protects the solar energy converter 1 against destructive factor in the ambient environment.

Figure 5:
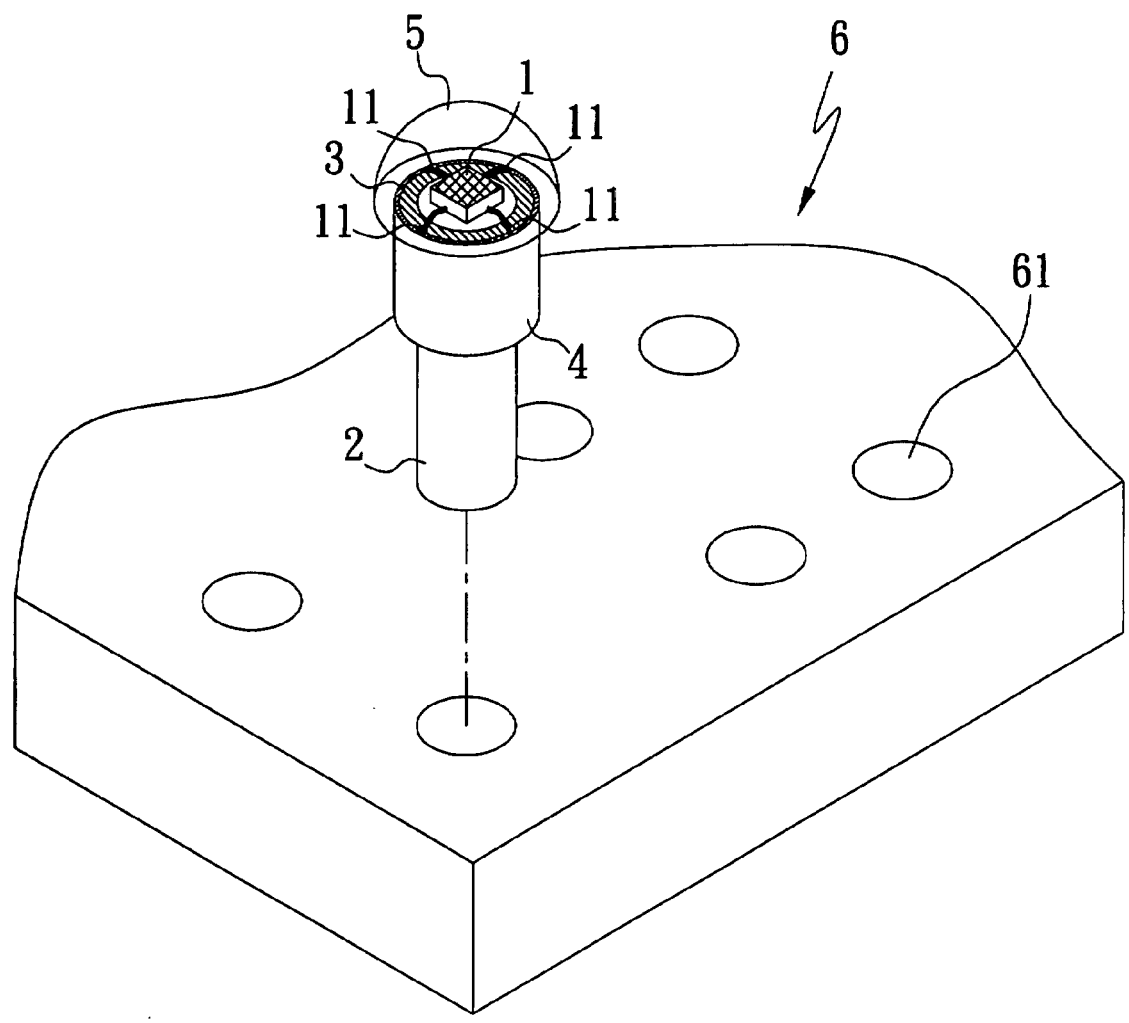
FIG. 5 shows the mounting of the solar power generating device of FIG. 4 to a circuit board.
Figure 6:
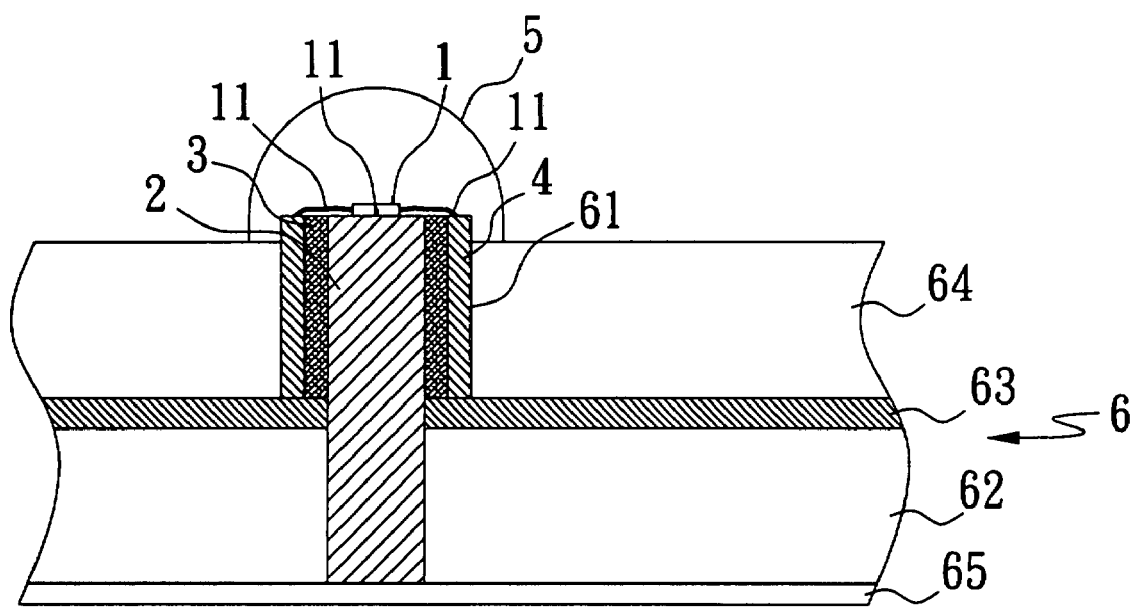
FIG. 6 is a fragmentary sectional view showing the solar power generating device of FIG. 4 mounted on a circuit board.

FIGS. 5 and 6 are perspective and sectional views, respectively, showing the mounting of the solar power generating device of the second embodiment to a circuit board 6. As shown, the solar power generating device of the present invention could be mounted on the circuit board 6 simply by aligning an end of the conductive body 2 opposite to the solar energy converter 1 with a predetermined insertion hole 61 on the circuit board 6, and plugging the device into the circuit board 6.

As can be clearly seen from FIG. 6, the circuit board 6 includes a substrate 65, on which a second conducting layer 64, a second insulating layer 63, and a first conducting layer 62 are sequentially provided. When the solar power generating device of the present invention has been plugged into the insertion hole 61 on the circuit board 6, a portion of the conductive body 2 not covered by the first insulating layer 3 is in electrical contact with the first conducting layer 62 covered on the substrate 65 of the circuit board 6, and the conducting layer 4 is isolated by the second insulating layer 63 from electrically contacting with the first conducting layer 62. However, the conducting layer 4 is in electrical contact with the second conducting layer 64 covered on the second insulating layer 63.

The solar energy converter 1 absorbs solar energy and converts the absorbed solar energy into electric energy, which is transferred via the conductive body 2 and the conducting layer 4 to the first conducting layer 62 and the second conducting layer 64, respectively, for powering other power-consuming components (not shown) on the circuit board 6 or storing in power accumulating means (not shown). Therefore, a wide variety of expanded applications is available from the solar power generating device of the present invention. Further, the solar power generating device of the present invention having been plugged into the circuit board 6 is not only stably supported on but also in correct electric contact with the circuit board 6, allowing easy mounting and replacement of the solar power generating device.

Figure 7:
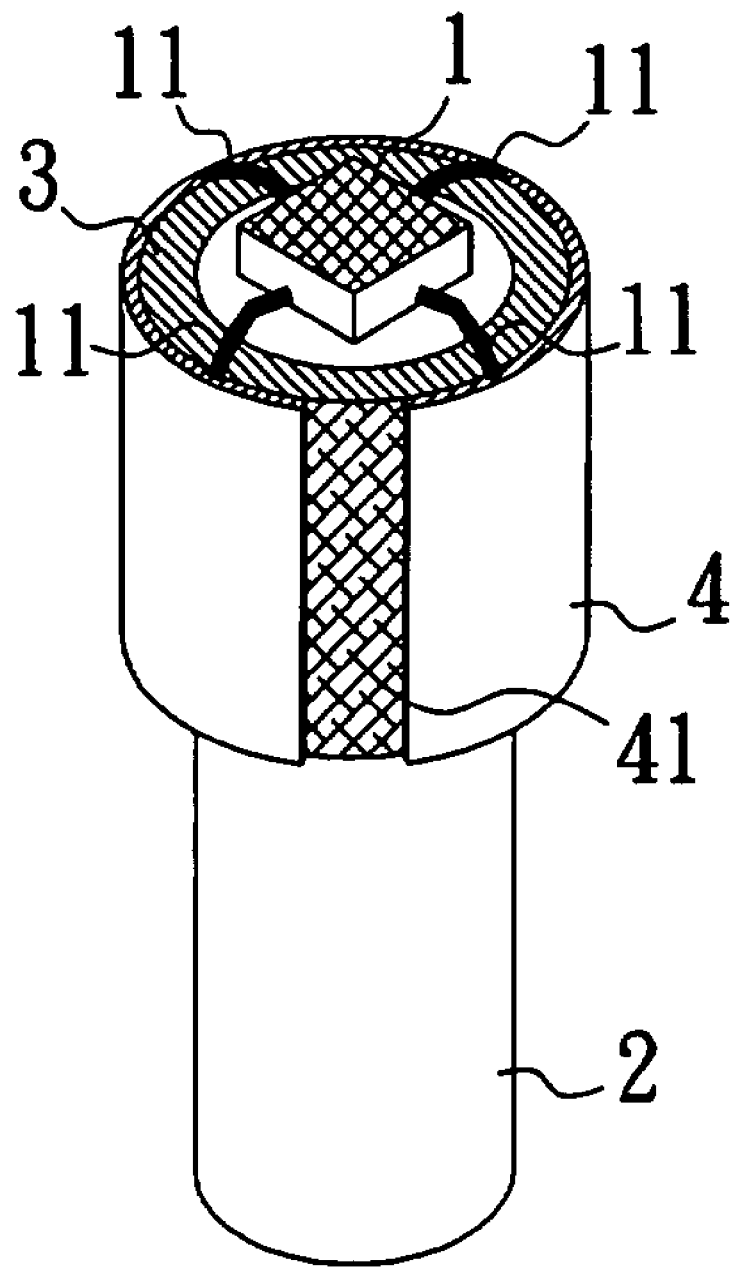
FIG. 7 is an assembled perspective view of a solar power generating device according to a third preferred embodiment of the present invention.

Please refer to FIG. 7 that shows a solar power generating device according to a third preferred embodiment of the present invention. To enable quick production of the solar power generating device of the present invention, the conducting layer 4 may be fitted around the first insulating layer 3 through a rolling process. The solar power generating device of the present invention produced in this manner would have an opening 41 formed on the conducting layer 4.

In the solar power generating device of the present invention, a hollow cylindrical conducting layer is fitted around another solid cylindrical conductive body with an insulating layer located between them, so that the solar power generating device is configured as a plug-in module that could be very easily mounted to and dismounted from a circuit board. With these arrangements, the present invention is novel, improved, and industrially valuable for use.

What is claimed is:

1. A solar power generating device, comprising:
   a conductive body in the form of a long bar;
   a solar energy converter being located at an end of the conductive body with a first electrode of the solar energy converter electrically contacting with that end of the conductive body, the solar energy converter being smaller than the end of the conductive body such that the solar energy converter fails to extend beyond an edge of the conductive body;
   a first insulating layer being fitted around a portion of the conductive body closer to the solar energy converter; and
   a conducting layer being fitted around the first insulating layer and therefore isolated from the conductive body by the first insulating layer, and the conducting layer being electrically connected to at least one second electrode of the solar energy converter;
   the conductive body being plugged into a circuit board with a portion of the conductive body not covered by the first insulating layer in electrical contact with a first conducting layer covered on a substrate of the circuit board; and the conducting layer being isolated from the first conducting layer by a second insulating layer covered on the first conducting layer but in electrical contact with a second conducting layer covered on the second insulating layer; and
   the solar energy converter being adapted to absorb solar energy and convert the absorbed solar energy into electric energy, which is then transferred to the first and the second conducting layer of the circuit board via the conductive body and the conducting layer, respectively.

2. The solar power generating device as claimed in claim 1, further comprising a solar-collecting hood to enclose an end of the conductive body having the solar energy converter located thereat, and to focus sun light on the solar energy converter.

3. The solar power generating device as claimed in claim 1, wherein the conductive body is a solid cylindrical body.

4. The solar power generating device as claimed in claim 1, wherein the conductive body is made of a copper material.

5. The solar power generating device as claimed in claim 1, wherein the conducting layer is fitted around the first insulating layer through a rolling process.

6. The solar power generating device as claimed in claim 1, wherein the conducting layer fitted around the first insulating layer is made of an aluminum material.

7. The solar power generating device as claimed in claim 1, wherein the conductive body is readily insertable into the circuit board and readily removable therefrom.

8. The solar power generating device as claimed in claim 3, wherein the conductive body is made of copper material.

9. The solar power generating device as claimed in claim 8, wherein both ends of the conductive body have a circular shape.

10. The solar power generating device as claimed in claim 1, wherein both ends of the conductive body have a circular shape.

11. The solar power generating device as claimed in claim 2, wherein the solar-collecting hood has a spherical dome-shape.

12. The solar power generating device as claimed in claim 1, wherein the conductive body, the first insulating layer and the conducting layer have a circular cross-section and wherein the first insulating layer surrounds the conductive body and wherein the conducting layer at least partially surrounds the first insulating layer.

* * * * *